United States Patent
Hsiao et al.

(10) Patent No.: US 9,306,501 B2
(45) Date of Patent: Apr. 5, 2016

(54) VOLTAGE ADJUSTING CIRCUIT FOR AMPLIFIER CIRCUIT AND METHOD THEREOF

(71) Applicant: Richtek Technology Corporation, Chupei, Hsinchu (TW)

(72) Inventors: Ming-Jun Hsiao, Zhubei (TW); Teng-Hung Chang, Kaohsiung (TW); Shao-Ming Sun, Zhubei (TW)

(73) Assignee: RICHTEK TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 14/162,406

(22) Filed: Jan. 23, 2014

(65) Prior Publication Data

US 2014/0210432 A1 Jul. 31, 2014

(30) Foreign Application Priority Data

Jan. 25, 2013 (TW) .............. 102103032 A

(51) Int. Cl.
*H03G 3/30* (2006.01)
*H03F 1/02* (2006.01)

(52) U.S. Cl.
CPC ............ *H03F 1/0233* (2013.01); *H03F 1/0255* (2013.01); *H03F 1/0211* (2013.01)

(58) Field of Classification Search
CPC ....... H03F 1/0261; H03F 1/0233; H03F 1/30; H03F 1/302; H03F 1/0244; H03F 1/0211; H03F 2200/504; H03G 3/3042; H03G 3/3047; H03G 3/3036; H03G 3/001; H03G 3/3052

USPC .......................... 330/279, 285, 297
See application file for complete search history.

(56) References Cited

U.S. PATENT DOCUMENTS

| | | | |
|---|---|---|---|
| 7,622,984 B2 | 11/2009 | Lesso et al. | |
| 7,626,445 B2 | 12/2009 | Lesso et al. | |
| 7,714,661 B2 | 5/2010 | Doy et al. | |
| 7,830,209 B1 | 11/2010 | Woodford et al. | |
| 8,008,975 B1 | 8/2011 | Allen et al. | |
| 8,188,794 B2 * | 5/2012 | Lautzenhiser | 330/285 |
| 8,810,317 B2 * | 8/2014 | Kadoi et al. | 330/285 |
| 2013/0177175 A1 | 7/2013 | Ting | |

FOREIGN PATENT DOCUMENTS

TW   201330649 A1   7/2013

* cited by examiner

*Primary Examiner* — Khanh V Nguyen
(74) *Attorney, Agent, or Firm* — Birch, Stewart, Kolasch & Birch, LLP

(57) ABSTRACT

A voltage adjusting circuit includes a reference voltage generating circuit, a subtractor circuit, a threshold generating circuit and a comparator circuit. The voltage adjusting circuit may provide power supply signals to an amplifier circuit so that the amplifier circuit may provide an output signal to a load according to an input signal. The subtractor circuit generates a difference signal according to the output signal and the power supply signal. The comparator circuit compares the difference signal and a threshold signal generated by the threshold generating circuit for configuring the reference voltage generating circuit to adjust the signal value of the power supply signal.

20 Claims, 6 Drawing Sheets

VOLTAGE ADJUSTING CIRCUIT FOR AMPLIFIER CIRCUIT AND METHOD THEREOF

CROSS-REFERENCE TO RELATED APPLICATIONS

This application claims the benefit of priority to Patent Application No. 102103032, filed in Taiwan on Jan. 25, 2013; the entirety of which is incorporated herein by reference for all purposes.

BACKGROUND

The disclosure generally relates to an amplifier circuit and, more particularly, to the voltage adjusting circuit for the amplifier circuit.

The awareness of the energy depletion has drawn people's attention to the energy efficiency of the electronic devices. Moreover, as for smart phones, table computers and other portable devices, the users always care about how long the portable devices may operate before recharging. Improving energy efficiency may effectively prolong the battery time of the electronic device. There are various ways to improve the energy efficiency of the electronic devices, e.g., improving the energy efficiency of the amplifier circuit commonly adopted in the electronic devices.

The amplifier circuit is usually coupled between two fixed voltage level (e.g., the voltage levels of the power supply and the ground) for receiving power signals to generate the amplified output signal according to the input signal. Because the signal value of the input signal may vary dynamically, the signal value of the output signal varies accordingly and may not be bounded in a fixed range. To prevent the output signal from being bounded by the signal value(s) of the output signal(s) and resulting in the signal distortion of the output signal, the signal range of the output signal must be carefully configured in a suitable range between the coupled voltage levels.

If the signal range of the output signal is configured in a smaller range, the difference between the output signal and the power signal(s) is larger and the energy efficiency of the amplifier circuit is poor. If the signal range of the output signal is configured in a larger range, the difference between the output signal and the power signal(s) is smaller and the signal distortion of the output signal may easily occur when the signal value of the output signal varies. The system performance may therefore be influenced.

U.S. Pat. No. 7,830,209 disclosed a device and a method for adjusting the power signal transmitted to the amplifier circuit according the signal value of the output signal. However, when the impedance of the load of the amplifier circuit or the signal value of the power signal(s) vary, the signal distortion of the output signal and the energy efficiency still may not be effectively improved with the proposed solution.

SUMMARY

In view of the foregoing, it may be appreciated that a substantial need exists for methods and apparatuses that mitigate or reduce the problems above.

An example embodiment of a voltage adjusting circuit is disclosed, configured to operably provide a first power signal and a second power signal to an amplifier circuit so that the amplifier circuit provides an output signal to a load according to an input signal, the first power signal and the second power signal, comprising: a reference voltage generating circuit configured to operably configure the first power signal to be a first signal value and configure the second power signal to be a second signal value in a first time period; a subtractor circuit coupled with the reference voltage generating circuit for generating a difference signal according to at least one of the first power signal and the second power signal and according to the output signal; a threshold generating circuit configured to operably generate a first threshold signal; and a comparator circuit coupled with the threshold generating circuit and the subtractor circuit for comparing the first threshold signal and the difference signal; wherein when the difference signal is greater than the first threshold signal, the comparator circuit configures the reference voltage generating circuit to configure the first power signal to be a third signal value and configure the second power signal to be a fourth signal value in a second time period; the third signal value is less than the first signal value; and the fourth signal value is greater than or equal to the second signal value.

Another example embodiment of a voltage adjusting method of an amplifier circuit is disclosed, for providing a first power signal and a second power signal to the amplifier circuit so that the amplifier circuit provides an output signal to a load according to an input signal, the first power signal and the second power signal, comprising: in a first time period, configuring the first power signal to be a first signal value and configuring the second power signal to be a second signal value by utilizing a reference voltage generating circuit; generating a difference signal by utilizing a subtractor circuit according to at least one of the first power signal and the second power signal and according to the output signal; generating a first threshold signal by utilizing a threshold generating circuit; comparing the first threshold signal and the difference signal by utilizing a comparator circuit; and when the difference signal is greater than the first threshold signal, configuring the reference voltage generating circuit to configure the first power signal to be a third signal value and configure the second power signal to be a fourth signal value in a second time period; wherein the third signal value is less than the first signal value and the fourth signal value is greater than or equal to the second signal value.

Another example embodiment of a voltage adjusting circuit is disclosed, configured to operably provide a first power signal and a second power signal to an amplifier circuit so that the amplifier circuit provides an output signal to a load according to an input signal, the first power signal and the second power signal, comprising: a reference voltage generating circuit configured to operably configure the first power signal to be a first signal value and configure the second power signal to be a second signal value in a first time period; a subtractor circuit coupled with the reference voltage generating circuit for generating a difference signal according to at least one of the first power signal and the second power signal and according to the output signal; a threshold generating circuit configured to operably generate a first threshold signal; and a comparator circuit coupled with the threshold generating circuit and the subtractor circuit for comparing the first threshold signal and the difference signal; wherein when the difference signal is greater than the first threshold signal, the comparator circuit configures the reference voltage generating circuit to configure the first power signal to be a third signal value and configure the second power signal to be a fourth signal value in a second time period; the third signal value is less than or equal to the first signal value; and the fourth signal value is greater than the second signal value.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

Figure 1:
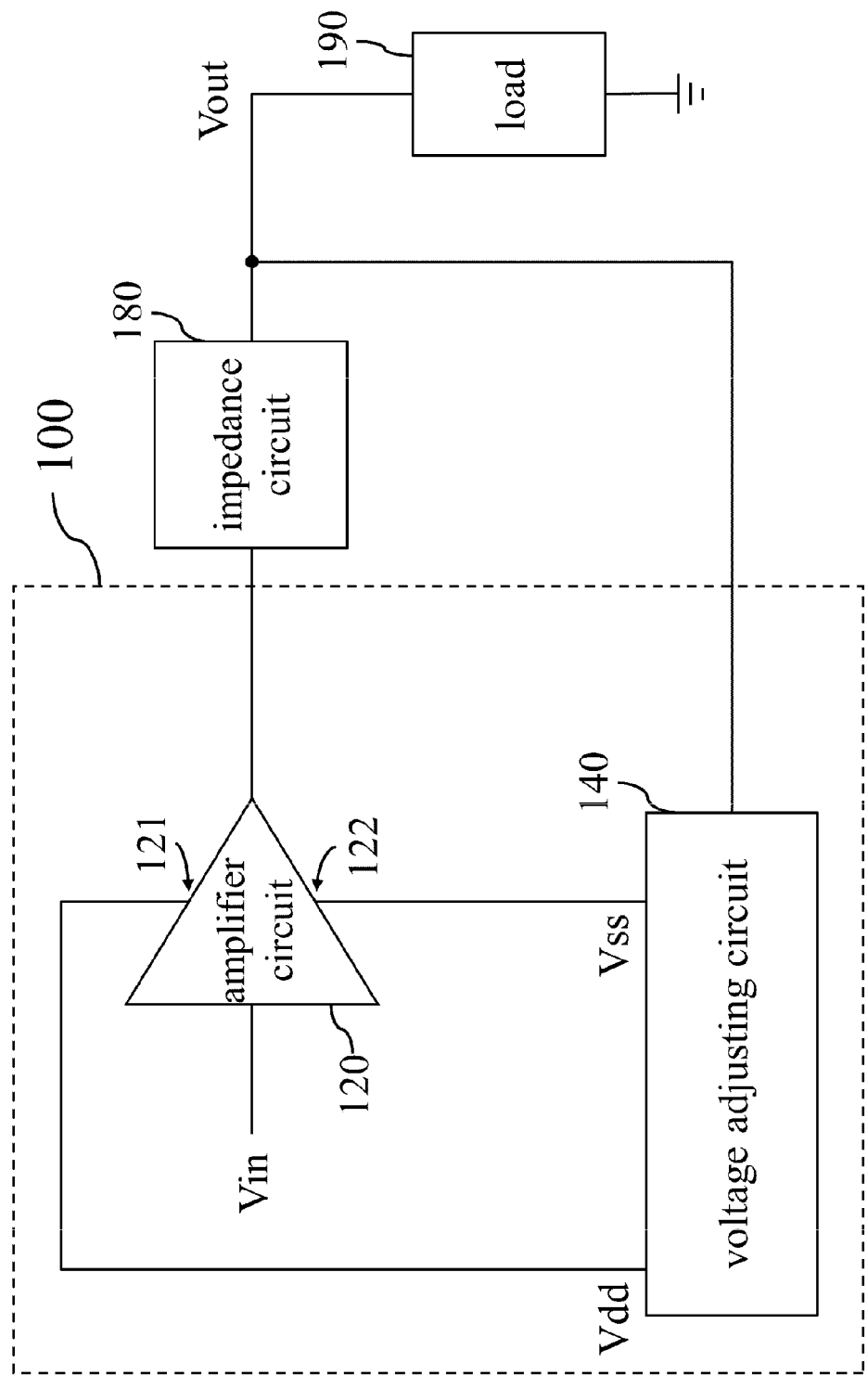
FIG. 1 shows a simplified functional block diagram of an audio signal generating device according to one embodiment of the present disclosure.

In the following description, the audio signal generating device 100 is utilized as an example to illustrate how to improve the energy efficiency of the audio signal generating device 100 by improving the amplifier circuit 120. FIG. 1 shows a simplified functional block diagram of an audio signal generating device 100 according to one embodiment of the present disclosure. The audio signal generating device 100 comprises an amplifier circuit 120 and a voltage adjusting circuit 140 for providing an output signal Vout to a load 190 through the impedance circuit 180. For the purposes of conciseness and clear explanation, some components and connections of the audio signal generating device 100 are not shown in FIG. 1. For example, the circuit for generating the input signal Vin in the audio signal generating device 100 is not shown in FIG. 1.

The amplifier circuit 120 comprises a positive power supply terminal 121 and a negative power supply terminal 122 for respectively receiving the first power signal Vdd and the second power signal Vss, and generates the output signal Vout according to the input signal Vin, the first power signal Vdd and the second power signal Vss. The amplifier circuit 120 may be realized with the operational amplifier, the instrumental amplifier, the transconductance amplifier, etc.

For the purpose of clear explanation, the input signal Vin and the output signal Vout of the amplifier circuit 120 are illustrated as single-ended signals in this embodiment. In other embodiments, the input signal Vin and the output signal Vout may be respectively expressed as the single-ended signal or the differential signal.

The voltage adjusting circuit 140 adjusts the signal values (e.g., the voltage value and the current value) of the first power signal Vdd and/or the second power signal Vss according to the output signal Vout so as to improve the energy efficiency of the audio signal generating device 100 and to prevent from the distortion of the output signal Vout.

In this embodiment, one or more circuit elements between the audio signal generating device 100 and the load 190 are illustrated as the impedance circuit 180 for the purpose of conciseness. The impedance circuit 180 may comprise inductors, capacitors, resistors, passive circuit elements, active circuit elements, etc. for providing the filtering function or the rectifying function. In other embodiments, the impedance circuit 180 may be omitted according to different design considerations. In other embodiments, the impedance circuit 180 may also be integrated in the audio signal generating device 100.

In this embodiment, the load 190 may the earphones, the speaker, the media player or other suitable audio output device. In real applications, the user may change the earphones or the speaker coupled with the audio signal generating device 100. Thus, the impedance of the load 190 may vary from time to time.

Figure 2:
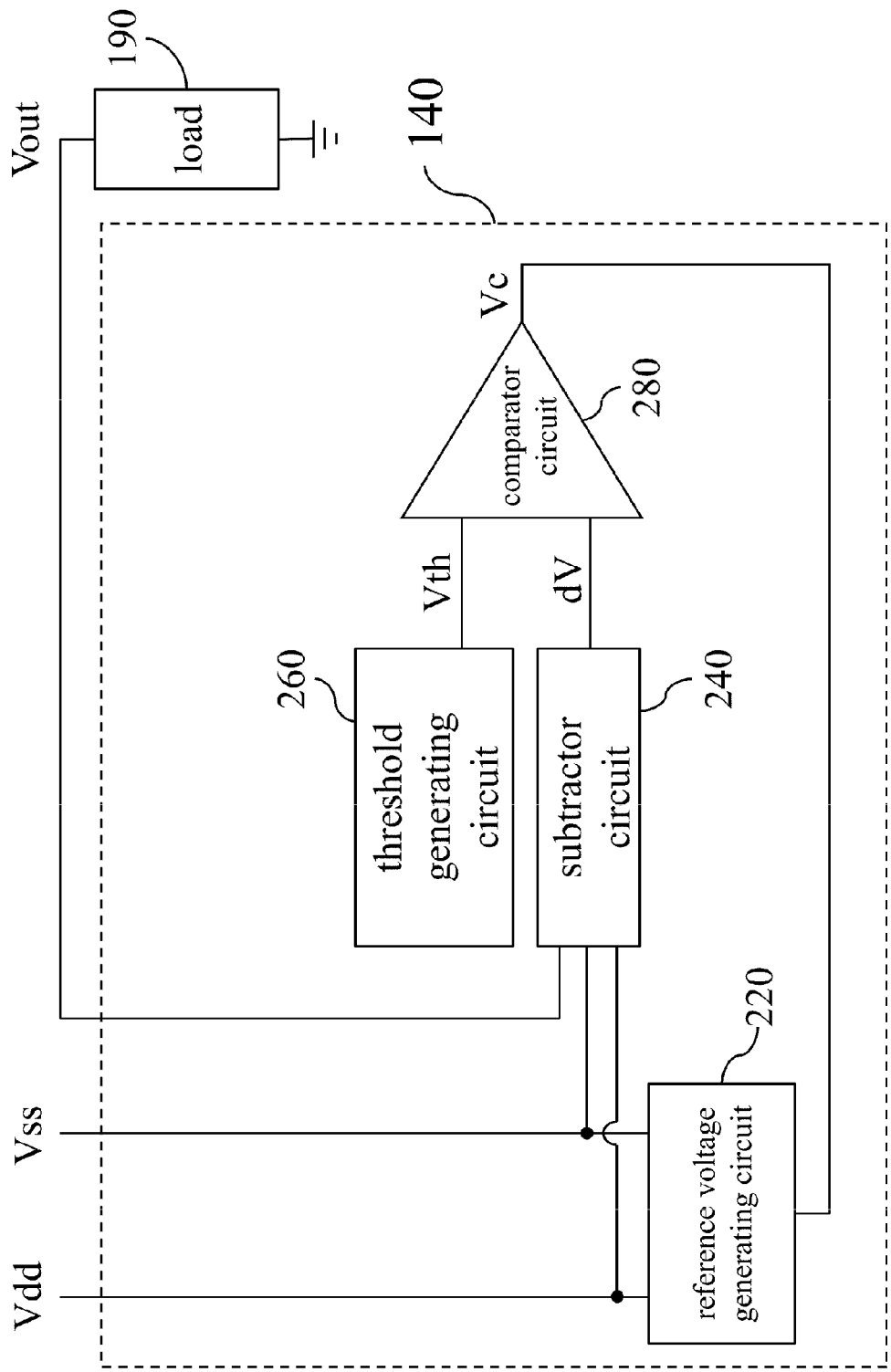
FIG. 2 shows a simplified functional block diagram of the voltage adjusting circuit in FIG. 1 according to one embodiment of the present disclosure.

FIG. 2 shows a simplified functional block diagram of the voltage adjusting circuit 140 in FIG. 1 according to one embodiment of the present disclosure. In the embodiment in FIG. 2, the voltage adjusting circuit 140 comprises a reference voltage circuit 220, a subtractor circuit 240, a threshold generating circuit 260 and a comparator circuit 280. For the purposes of conciseness and clear explanation, some components and connections of the voltage adjusting circuit 140 are not shown in FIG. 2.

The reference voltage generating circuit 220 may be realized with the charge pump circuit, the bandgap circuit, the current source circuit, the voltage source circuit, etc. for configuring the first power signal Vdd and the second power signal Vss to be the suitable signal values. For example, in one embodiment, the first power signal Vdd may be configured to be one of 5V, 4V and 2.5V, and the second power signal Vss may be configured to be one of 0V, 0.5V and 1.5V. In another embodiment, the first power signal Vdd may be configured to be one of 5V, 4V and 3V, and the second power signal Vss may only be configured to be 0V. In another embodiment, the first power signal Vdd may only be configured to be 5V, and the second power signal Vss may be configured to be one of 0V, 1V and 2V.

The subtractor circuit 240 is coupled with the reference voltage generating circuit 220 and the load 190 for generating one or more difference signal dV according to at least one of the first power signal Vdd and the second power signal Vss and according to the output signal Vout. For example, the subtractor circuit 240 may generate the difference signal dV according to a first minimal difference between the first power signal Vdd and the output signal Vout, according to a second minimal difference between the second power signal Vss and the output signal Vout, the minimal value of the first minimal difference and the second minimal difference, etc. In other embodiments, the subtractor circuit 240 may also provide two or more difference signals according to different design considerations. The subtractor circuit 240 may be realized with the comparator circuit, the error amplifier circuit, the suitable combination of active circuit elements and passive elements, etc. for generating the difference signal dV.

The threshold generating circuit 260 may be realized with the charge pump circuit, the bandgap circuit, the current source circuit, the voltage source circuit, etc. for generating one or more threshold signal Vth. For example, the threshold generating circuit 260 may be realized by storing the required value of the threshold signal in the register for converting to the required threshold signal Vth with analog-to-digital converting circuit.

The comparator circuit 280 is coupled with the threshold generating circuit 260 and the subtractor circuit 240. The comparator circuit 280 may generate the control signal Vc according to the difference signal dV and the threshold signal Vth for configuring the reference voltage generating circuit 220 to configure the first power signal Vdd and the second power signal Vss to be suitable signal values. The comparator circuit 280 may be realized with the circuit structure with a positive gain, a negative gain or with a unity gain for generating the control signal Vc in the analog form and/or in the digital form.

For example, in one embodiment, the threshold generating circuit 260 generates a first threshold signal Vth1 and a second threshold signal Vth2. When the difference signal dV is greater than the first threshold signal Vth1, it means the difference signal dV between the output signal Vout and the power signal (e.g., the first power signal Vdd and the second power signal Vss) is too large so that the energy efficiency of the amplifier circuit 120 is poor. Thus, the comparator circuit 280 generates the control signal Vc according to the difference signal dV and the first threshold signal Vth1 for configuring the reference voltage generating circuit 220 to decrease the signal value of the first power signal Vdd and/or increase the signal value or the second power signal Vss. The energy efficiency may therefore be improved by configuring the first power signal Vdd to be a lower signal value and/or configuring the second power signal Vss to be a higher signal value.

When the difference signal dV is less than the second threshold signal Vth2, it means the difference signal dV between the output signal Vout and the power signal (e.g., the first power signal Vdd and the second power signal Vss) is too small so that the output signal Vout is easily bounded by the power signal and distorted. Thus, the comparator circuit 280 generates the control signal Vc according to the difference signal dV and the second threshold signal Vth2 for configuring the reference voltage generating circuit 220 to increase the signal value of the first power signal Vdd and/or decrease the signal value or the second power signal Vss. The distortion of the output signal Vout may therefore be improved by configuring the first power signal Vdd to be a higher signal value and/or configuring the second power signal Vss to be a lower signal value.

Moreover, in the above embodiments, the signal values of the first threshold signal Vth1 and the second threshold signal Vth2 may be configured to be the same or different.

Figure 3:
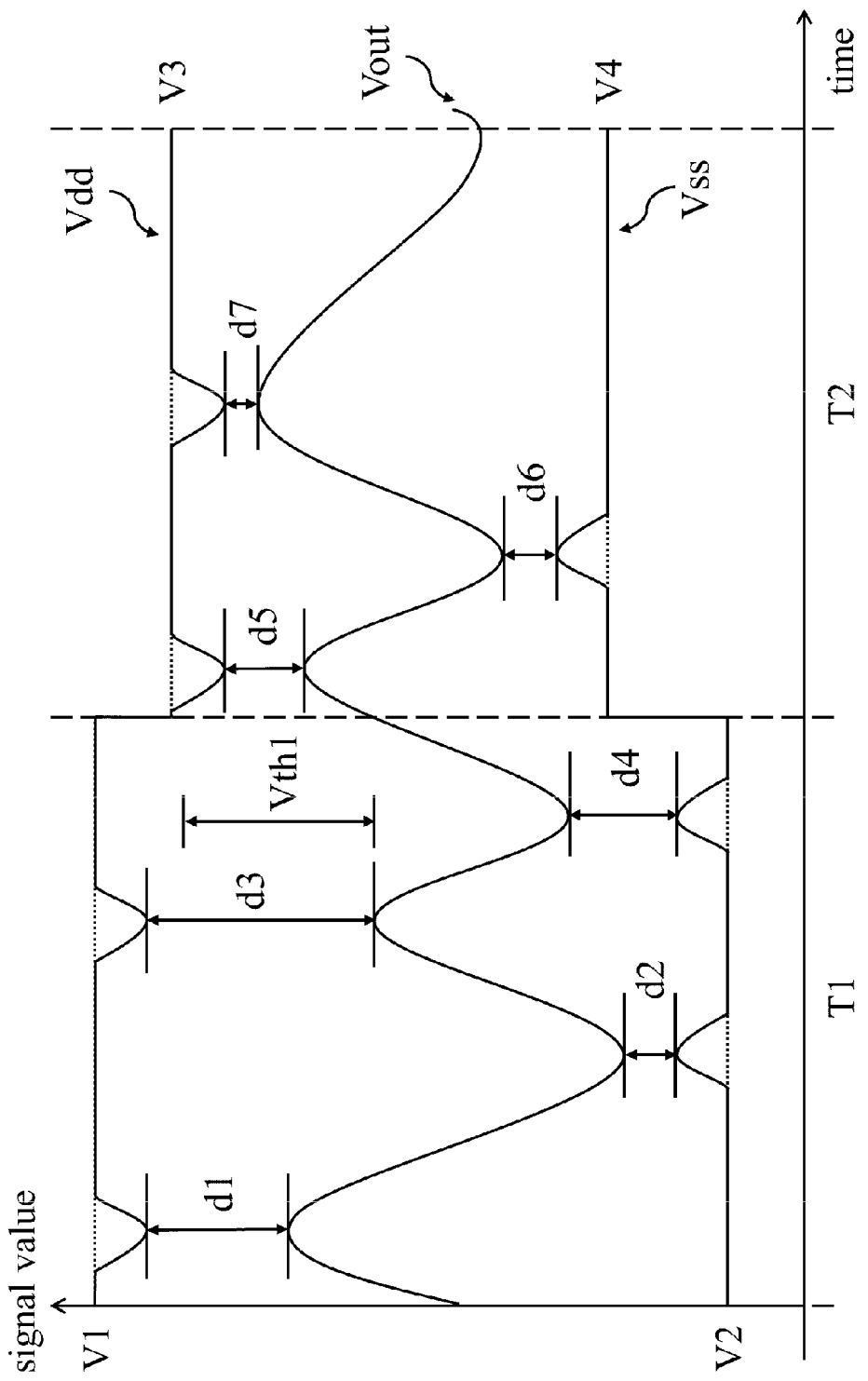
FIG. 3 shows several simplified waveforms of the signals generated by the voltage adjusting circuit in FIG. 2 according to one embodiment of the present disclosure.

FIG. 3 shows several simplified waveforms of the signals generated by the voltage adjusting circuit 140 in FIG. 2 according to one embodiment of the present disclosure. The operation of the voltage adjusting circuit 140 is further explained below with FIGS. 1-3.

When the signal value of the output signal Vout provided to the load is higher, the amplifier circuit 120 needs to increase the current provided to the load by utilizing the first power signal Vdd. Thus, the signal value of the first power signal Vdd is decreased. When the signal value of the output signal Vout provided to the load is lower, the amplifier circuit 120 needs to increase the current received from the load by utilizing the second power signal Vss. Thus, the signal value of the second power signal Vss is increased.

In the time period T1, the reference voltage generating circuit 220 configures the signal value of the first power signal Vdd to be a first signal value V1 and configures the signal value of the second power signal Vss to be a second signal value V2. The subtractor circuit 240 generates four signal values d1, d2, d3 and d4 of the difference signal dV according to the minimal difference between the first power signal Vdd and the output signal Vout and according to the minimal difference between the second power signal Vss and the output signal Vout.

When the signal value d3 of the difference signal dV is greater than the first threshold signal Vth1 generated by the threshold generating circuit 260, it means the difference signal dV between the output signal Vout and the first power signal Vdd is too large and the energy efficiency of the amplifier circuit 120 is poor.

In the time period T2, the reference voltage generating circuit 220 configures the first power signal Vdd to be a third signal value V3 and configures the second power signal Vss to be a fourth signal value V4. Therefore, the signal values d5, d6 and d7 of the difference signal dV may be less than the first threshold signal Vth1. Moreover, because the third signal value V3 is less than the first signal value V1 and the fourth signal value V4 is greater than the second signal value V2, the voltage adjusting circuit 140 may generate the output signal Vout according to the first power signal Vdd with a lower signal value and the second power signal Vss with a higher signal value. Thus, the energy efficiency of the amplifier circuit 120 may be improved.

Figure 4:
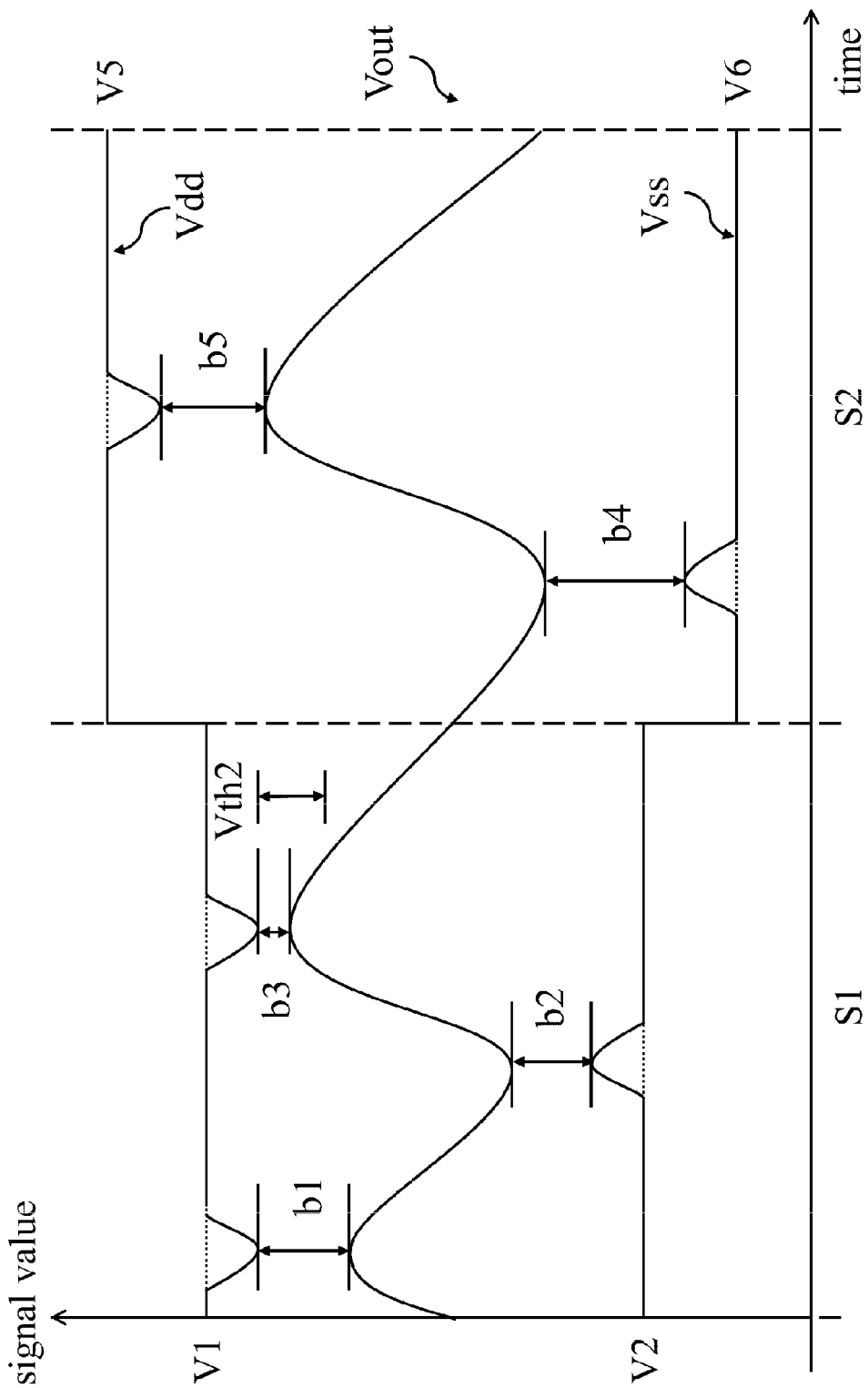
FIG. 4 shows several simplified waveforms of the signals generated by the voltage adjusting circuit in FIG. 2 according to another embodiment of the present disclosure.

FIG. 4 shows several simplified waveforms of the signals generated by the voltage adjusting circuit 140 in FIG. 2 according to another embodiment of the present disclosure. The operation of the voltage adjusting circuit 140 is further explained below with FIGS. 1, 2 and 4.

In the time period S1, the reference voltage generating circuit 220 configures the signal value of the first power signal Vdd to be a first signal value V1 and configures the signal value of the second power signal Vss to be a second signal value V2. The subtractor circuit 240 generates three signal values b1, b2, and b3 of the difference signal dV according to the minimal difference between the first power signal Vdd and the output signal Vout and according to the minimal difference between the second power signal Vss and the output signal Vout.

When the signal value b3 of the difference signal dV is less than the second threshold signal Vth2 generated by the threshold generating circuit 260, it means the difference signal dV between the output signal Vout and the first power signal Vdd is too small and the output signal Vout is easily bounded by the power signal and distorted.

In the time period S2, the reference voltage generating circuit 220 configures the first power signal Vdd to be a fifth signal value V5 and configures the second power signal Vss to be a sixth signal value V6. Therefore, the signal values b4 and d5 of the difference signal dV may be greater than the second threshold signal Vth2. Moreover, because the fifth signal value V5 is greater than the first signal value V1 and the sixth signal value V6 is less than the second signal value V2, the voltage adjusting circuit 140 may generate the output signal Vout according to the first power signal Vdd with a higher signal value and the second power signal Vss with a lower signal value. Thus, the signal distortion of the output signal Vout may be improved.

Figure 5:
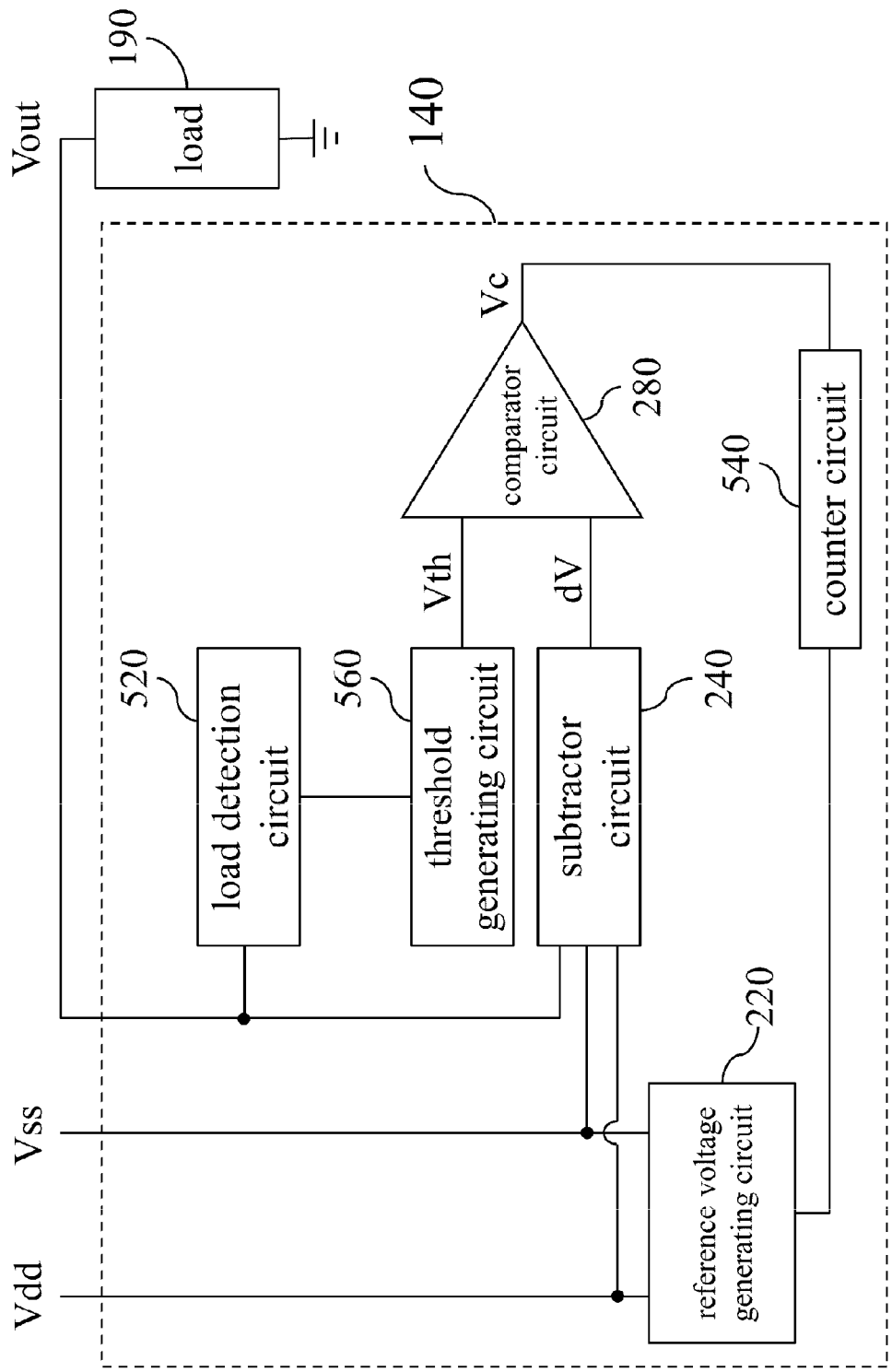
FIG. 5 shows a simplified functional block diagram of the voltage adjusting circuit in FIG. 1 according to another embodiment of the present disclosure.
Figure 6:
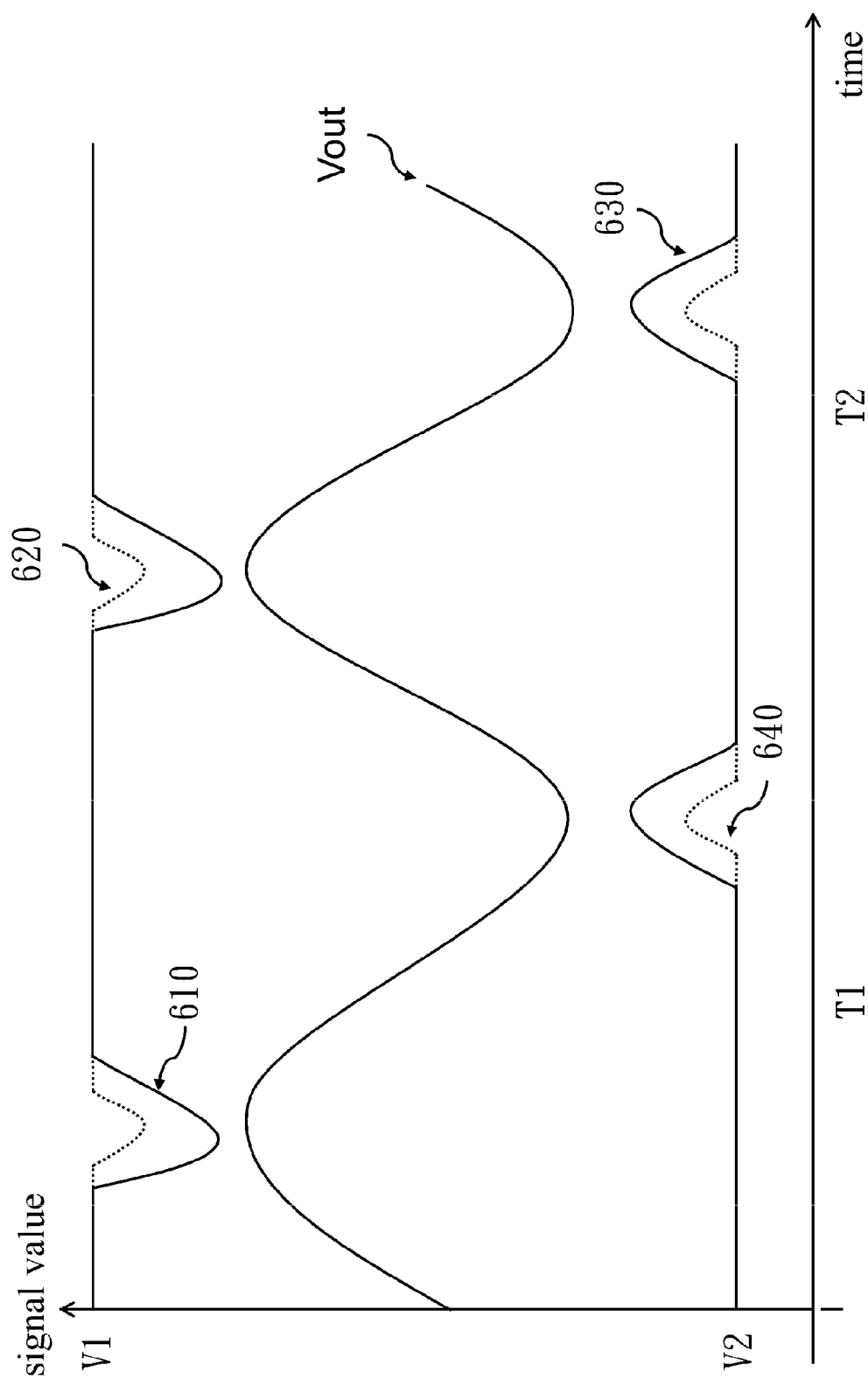
FIG. 6 shows several simplified waveforms of the signals generated by the voltage adjusting circuit in FIG. 5 according to one embodiment of the present disclosure.

FIG. 5 shows a simplified functional block diagram of the voltage adjusting circuit 140 in FIG. 1 according to another embodiment of the present disclosure. FIG. 6 shows several simplified waveforms of the signals generated by the voltage adjusting circuit 140 in FIG. 5 according to one embodiment of the present disclosure.

In the embodiment in FIG. 5, in addition to the reference voltage generating circuit 220, the subtractor circuit 240 and the comparator circuit 280 in FIG. 2, the voltage adjusting circuit 140 in FIG. 5 further comprises a load detection circuit 520, a counter circuit 540 and a threshold generating circuit 560. For the purposes of conciseness and clear explanation, some components and connections of the voltage adjusting circuit 140 are not shown in FIG. 5. In the embodiment in FIG. 5, the reference voltage generating circuit 220, the subtractor circuit 240 and the comparator circuit 280 may be realized with the same or similar structures in FIG. 2, and the operations thereof are omitted for conciseness.

The load detection circuit 520 may be realized with digital circuits, analog circuits or the combination thereof for detecting the impedance value of the load. For example, the load detection circuit 520 may utilize a current source circuit to transmit signals of several different frequencies to the load 190 and calculates the impedance of the load 190 accordingly. Moreover, the threshold generating circuit 560 is coupled with the load detection circuit 520 for configuring the signal value of the generated threshold signal according to the configuration of the load detection circuit 520.

When the signal value of the output signal Vout provided to the load is higher, the amplifier circuit 120 needs to increase the current provided to the load by utilizing the first power signal Vdd. Thus, the signal value of the first power signal Vdd is decreased. When the signal value of the output signal Vout provided to the load is lower, the amplifier circuit 120 needs to increase the current received from the load by utilizing the second power signal Vss. Thus, the signal value of the second power signal Vss is increased.

When the impedance value of the load 190 is smaller, the variation of the signal values of the first power signal Vdd and the second power signal Vss are larger. The curves 610 and 630 in FIG. 6 respectively represent the waveforms of the first power signal Vdd and the second power signal Vss when the impedance value of the load 190 is smaller according to one embodiment of the present disclosure.

When the impedance value of the load 190 is larger, the variation of the signal values of the first power signal Vdd and the second power signal Vss are smaller. The curves 620 and 640 in FIG. 6 respectively represent the waveforms of the first power signal Vdd and the second power signal Vss when the impedance value of the load 190 is larger according to one embodiment of the present disclosure.

The voltage adjusting circuit 140 may utilize the load detection circuit 520 to detect the impedance value of the load 190 and configure the threshold generating circuit 560 to adjust the generated threshold signal(s) accordingly. For example, when the impedance value of the load 190 is less than a first predetermined impedance threshold, the load detection circuit 520 configures the threshold generating circuit 560 to output the first threshold signal Vth1 and the second threshold signal Vth2. When the impedance value of the load 190 is greater than a first predetermined impedance threshold, the load detection circuit 520 configures the threshold generating circuit 560 to output the third threshold signal Vth3 and the fourth threshold signal Vth4. Moreover, the third threshold signal Vth3 is less than the first threshold signal, and the fourth threshold signal Vth4 is less than the second threshold signal Vth2. In another embodiment, when the impedance value of the load is less than a second predetermined impedance threshold (which is less than the first predetermined impedance threshold), the load detection circuit 520 configures the threshold generating circuit 560 to output the fifth threshold signal Vth5 and the sixth threshold signal Vth6. Moreover, the fifth threshold signal Vth5 is greater than the first threshold signal, and the sixth threshold signal Vth6 is greater than the second threshold signal Vth2.

When the impedance value of the load 190 is smaller, the variation of the signal values of the first power signal Vdd and the variation of the second power signal Vss are larger. The output signal Vout is easily bounded by the first power signal Vdd and the second power signal Vss, which results in the signal distortion. Thus, the load detection circuit 520 may configure the threshold generating circuit 560 to increase one or more of the generated threshold signals to prevent from the distortion of the output signal Vout.

When the impedance value of the load 190 is larger, the variation of the signal values of the first power signal Vdd and the second power signal Vss are smaller. The output signal Vout is not easily bounded by the first power signal Vdd and the second power signal Vss, and the signal distortion seldom occurs. Thus, the load detection circuit 520 may configure the threshold generating circuit 560 to decrease one or more of the generated threshold signals to improve the energy efficiency of the amplifier circuit 120.

In the embodiment in FIG. 5, the counter circuit 540 is configured to operably calculate the accumulated number that the difference signal dV is greater than the threshold signal and/or the accumulated number that the difference signal dV is less than the threshold signal for configuring the reference voltage generating circuit 220 to adjust the first power signal Vdd and/or the second power signal Vss. For example, when the accumulated number that the difference signal is greater than the first threshold signal Vth1 is greater than a predetermined accumulation number, the counter circuit 540 configures the reference voltage generating circuit 220 to decrease the signal value of the first power signal Vdd and/or increase the signal value of the second power signal Vss. In another embodiment, when the accumulated number that the difference signal is less than the second threshold signal Vth2 is greater than a predetermined accumulation number, the counter circuit 540 configures the reference voltage generating circuit 220 to increase the signal value of the first power signal Vdd and/or decrease the signal value of the second power signal Vss.

In the above embodiments, each functional block may be respectively realized with one or more circuit elements according to difference design considerations. For example, the amplifier circuit 120 and the voltage adjusting circuit 140 may be configured in the same integrated circuit element or may be respectively realized with one or more integrated circuit elements and/or discrete circuit elements.

In another embodiment, the counter circuit 540 may be utilized in the voltage adjusting circuit 140 in FIG. 2 for configuring the reference voltage generating circuit 220 to adjust the signal value of the first power signal Vdd and/or the signal value of the second power signal Vss. In another embodiment, the counter circuit 540 and relevant operations may be omitted in the voltage adjusting circuit 140 in FIG. 5, and the comparator circuit 280 is utilized to configure the reference voltage generating circuit 220 to adjust the first power signal Vdd and the second power signal Vss.

In the above embodiments, the voltage adjusting circuit 140 may also be configured to adjust only one of the signal values of the first power signal Vdd and the second power signal Vss, or to adjust both of the signal values of the first power signal Vdd and the second power signal Vss.

In the above embodiments, the voltage adjusting circuit may properly adjust the signal value(s) of the power signal(s) transmitted to the amplifier circuit according the characteristic of the output signal. Therefore, the energy efficiency of the amplifier circuit and the signal distortion of the output signal may be improved. Moreover, the voltage adjusting circuit may adjust the signal value(s) of the power signal(s) transmitted to the amplifier circuit according to the impedance of the load and the calculation result of the counter circuit. Thus, the energy efficiency and the signal quality of the output signal may be further improved.

In the above embodiments, the voltage adjusting circuit may configure the reference voltage generating circuit to adjust the signal value(s) of the power signal(s) according the difference between the output signal and the power signal(s). Thus, When the impedance of the load or the signal value of the power signal vary, the voltage adjusting circuit may still properly configure the reference voltage generating circuit so that the energy efficiency and the signal quality of the output signal may be still maintained.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled with," "couples with," and "coupling with" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

The term "voltage signal" used throughout the description and the claims may be expressed in the format of a current in implementations, and the term "current signal" used throughout the description and the claims may be expressed in the format of a voltage in implementations.

In the drawings, the size and relative sizes of some elements may be exaggerated or simplified for clarity. Accordingly, unless the context clearly specifies, the shape, size, relative size, and relative position of each element in the drawings are illustrated merely for clarity, and not intended to be used to restrict the claim scope.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A voltage adjusting circuit, configured to operably provide a first power signal and a second power signal to an amplifier circuit so that the amplifier circuit provides an output signal to a load according to an input signal, the first power signal and the second power signal, comprising:
    a reference voltage generating circuit configured to operably configure the first power signal to be a first signal value and configure the second power signal to be a second signal value in a first time period;
    a subtractor circuit coupled with the reference voltage generating circuit for generating a difference signal according to at least one of the first power signal and the second power signal and according to the output signal;
    a threshold generating circuit configured to operably generate a first threshold signal; and
    a comparator circuit coupled with the threshold generating circuit and the subtractor circuit for comparing the first threshold signal and the difference signal;
    wherein when the difference signal is greater than the first threshold signal, the comparator circuit configures the reference voltage generating circuit to configure the first power signal to be a third signal value and configure the second power signal to be a fourth signal value in a second time period; the third signal value is less than the first signal value; and the fourth signal value is greater than or equal to the second signal value.

2. The voltage adjusting circuit of claim 1, further comprising:
    a counter circuit coupled with the comparator circuit and the reference voltage generating circuit for calculating an accumulated number that the difference signal is less than the first threshold signal;
    wherein when the accumulated number is greater than a predetermined accumulation number, the counter circuit configures the reference voltage generating circuit to configure the first power signal to be the third signal value and configure the second power signal in the second time period.

3. The voltage adjusting circuit of claim 1, wherein the threshold generating circuit further generates a second threshold signal and the comparator circuit compares the second threshold signal and the difference signal; when the difference signal is less than the second threshold signal, the comparator circuit configures the reference voltage generating circuit to configure the first power signal to be a fifth signal value and configure the second power signal to be a sixth signal value in a third time period; and the fifth signal value is greater than the first signal value and the sixth signal value is less than or equal to the second signal value.

4. The voltage adjusting circuit of claim 1, further comprising:
    a load detection circuit coupled with the threshold generating circuit for detecting an impedance value of the load;
    wherein when the impedance value of the load is less than a first predetermined impedance threshold, the load detection circuit configures the threshold generating circuit to provide the first threshold signal to the reference voltage generating circuit; when the impedance of the load is greater than the first predetermined impedance threshold, the load detection circuit configures the threshold generating circuit to provide a third threshold signal to the reference voltage generating circuit; and the third threshold signal is less than the first threshold signal.

5. The voltage adjusting circuit of claim 4, wherein the impedance of the load is less than a second predetermined impedance threshold, the load detection circuit configures the threshold generating circuit to provide a fifth threshold signal to the reference voltage generating circuit; the first predetermined impedance threshold is greater than the second predetermined impedance threshold; and the fifth threshold signal is greater than the first threshold signal.

6. The voltage adjusting circuit of claim 2, wherein
    a load detection circuit coupled with the threshold generating circuit for detecting an impedance value of the load;
    wherein when the impedance value of the load is less than a first predetermined impedance threshold, the load detection circuit configures the threshold generating circuit to provide the first threshold signal to the reference voltage generating circuit; when the impedance of the load is greater than the first predetermined impedance threshold, the load detection circuit configures the threshold generating circuit to provide a third threshold signal to the reference voltage generating circuit; and the third threshold signal is less than the first threshold signal.

7. The voltage adjusting circuit of claim 6, wherein the impedance of the load is less than a second predetermined impedance threshold, the load detection circuit configures the threshold generating circuit to provide a fifth threshold signal to the reference voltage generating circuit; the first predetermined impedance threshold is greater than the second predetermined impedance threshold; and the fifth threshold signal is greater than the first threshold signal.

8. The voltage adjusting circuit of claim 6, wherein when the impedance of the load is less than the first predetermined impedance threshold, the load detection circuit configures the threshold generating circuit to provide the second threshold signal to the reference voltage generating circuit; when the impedance of the load is greater than the first predetermined impedance threshold, the load detection circuit configures the threshold generating circuit to provide a fourth threshold signal to the reference voltage generating circuit; and the fourth threshold signal is less than the second threshold signal.

9. The voltage adjusting circuit of claim 6, wherein when the impedance of the load is less than a second predetermined impedance threshold, the load detection circuit configures the threshold generating circuit to provide a sixth threshold signal to the reference voltage generating circuit; the first predetermined impedance threshold is greater than the second predetermined impedance threshold; and the sixth threshold signal is greater than the second threshold signal.

10. A voltage adjusting method of an amplifier circuit for providing a first power signal and a second power signal to the amplifier circuit so that the amplifier circuit provides an output signal to a load according to an input signal, the first power signal and the second power signal, comprising:
in a first time period, configuring the first power signal to be a first signal value and configuring the second power signal to be a second signal value by utilizing a reference voltage generating circuit;
generating a difference signal by utilizing a subtractor circuit according to at least one of the first power signal and the second power signal and according to the output signal;
generating a first threshold signal by utilizing a threshold generating circuit;
comparing the first threshold signal and the difference signal by utilizing a comparator circuit; and
when the difference signal is greater than the first threshold signal, configuring the reference voltage generating circuit to configure the first power signal to be a third signal value and configure the second power signal to be a fourth signal value in a second time period;
wherein the third signal value is less than the first signal value and the fourth signal value is greater than or equal to the second signal value.

11. The voltage adjusting method of claim 10, further comprising:
calculating an accumulated number that the difference signal is less than the first threshold signal by utilizing a counter circuit;
when the accumulated number is greater than a predetermined accumulation number, configuring the reference voltage generating circuit to configure the first power signal to be the third signal value and configure the second power signal to be the fourth signal value in the second time period.

12. The voltage adjusting method of claim 10, further comprising:
generating a second threshold signal by utilizing the threshold generating circuit;
comparing the second threshold signal and the difference signal by utilizing the comparator circuit; and
when the difference signal is less than the second threshold signal, configuring the reference voltage generating circuit to configure the first power signal to be a fifth signal value and configure the second power signal to be a sixth signal value in a third time period;
wherein the fifth signal value is greater than the first signal value and the sixth signal value is less than or equal to the second signal value.

13. The voltage adjusting method of claim 10, further comprising:
detecting an impedance value of the load by utilizing a load detection circuit;
when the impedance value of the load is less than a first predetermined impedance threshold, configuring the threshold generating circuit to provide the first threshold signal to the reference voltage generating circuit; and
when the impedance of the load is greater than the first predetermined impedance threshold, configuring the threshold generating circuit to provide a third threshold signal to the reference voltage generating circuit;
wherein the third threshold signal is less than the first threshold signal.

14. The voltage adjusting method of claim 13, further comprising:
when the impedance of the load is less than a second predetermined impedance threshold, configuring the threshold generating circuit to provide a fifth threshold signal to the reference voltage generating circuit;
wherein the first predetermined impedance threshold is greater than the second predetermined impedance threshold, and the fifth threshold signal is greater than the first threshold signal.

15. The voltage adjusting method of claim 11, further comprising:
detecting an impedance value of the load by utilizing a load detection circuit;
when the impedance value of the load is less than a first predetermined impedance threshold, configuring the threshold generating circuit to provide the first threshold signal to the reference voltage generating circuit; and
when the impedance of the load is greater than the first predetermined impedance threshold, configuring the threshold generating circuit to provide a third threshold signal to the reference voltage generating circuit;
wherein the third threshold signal is less than the first threshold signal.

16. The voltage adjusting method of claim 15, further comprising:
when the impedance of the load is less than a second predetermined impedance threshold, configuring the threshold generating circuit to provide a fifth threshold signal to the reference voltage generating circuit;
wherein the first predetermined impedance threshold is greater than the second predetermined impedance threshold, and the fifth threshold signal is greater than the first threshold signal.

17. The voltage adjusting method of claim 15, further comprising:
when the impedance of the load is less than the first predetermined impedance threshold, configuring the threshold generating circuit to provide the second threshold signal to the reference voltage generating circuit; and
when the impedance of the load is greater than the first predetermined impedance threshold, configuring the threshold generating circuit to provide a fourth threshold signal to the reference voltage generating circuit;
wherein the fourth threshold signal is less than the second threshold signal.

18. The voltage adjusting method of claim 15, further comprising:
when the impedance of the load is less than a second predetermined impedance threshold, configuring the threshold generating circuit to provide a sixth threshold signal to the reference voltage generating circuit;
wherein the first predetermined impedance threshold is greater than the second predetermined impedance threshold and the sixth threshold signal is greater than the second threshold signal.

19. A voltage adjusting circuit, configured to operably provide a first power signal and a second power signal to an amplifier circuit so that the amplifier circuit provides an output signal to a load according to an input signal, the first power signal and the second power signal, comprising:
a reference voltage generating circuit configured to operably configure the first power signal to be a first signal value and configure the second power signal to be a second signal value in a first time period;
a subtractor circuit coupled with the reference voltage generating circuit for generating a difference signal according to at least one of the first power signal and the second power signal and according to the output signal;
a threshold generating circuit configured to operably generate a first threshold signal; and
a comparator circuit coupled with the threshold generating circuit and the subtractor circuit for comparing the first threshold signal and the difference signal;
wherein when the difference signal is greater than the first threshold signal, the comparator circuit configures the reference voltage generating circuit to configure the first power signal to be a third signal value and configure the second power signal to be a fourth signal value in a second time period; the third signal value is less than or equal to the first signal value; and the fourth signal value is greater than the second signal value.

20. The voltage adjusting circuit of claim 19, wherein the threshold generating circuit further generates a second threshold signal and the comparator circuit compares the second threshold signal and the difference signal; when the difference signal is less than the second threshold signal, the comparator circuit configures the reference voltage generating circuit to configure the first power signal to be a fifth signal value and configure the second power signal to be a sixth signal value in a third time period; and the fifth signal value is greater than or equal to the first signal value and the sixth signal value is less than or equal to the second signal value.

* * * * *